(12) United States Patent  
Lee

(10) Patent No.: US 8,044,700 B2
(45) Date of Patent: Oct. 25, 2011

(54) SYSTEMS INCLUDING LEVEL SHIFTER HAVING VOLTAGE DISTRIBUTOR

(75) Inventor: Ching-Hone Lee, Hsin-Chu (TW)

(73) Assignee: TPO Displays Corp. (TW)

( * ) Notice: Subject to any disclaimer, the term of this patent is extended or adjusted under 35 U.S.C. 154(b) by 0 days.

(21) Appl. No.: 12/843,319

(22) Filed: Jul. 26, 2010

(65) Prior Publication Data

US 2010/0289552 A1    Nov. 18, 2010

Related U.S. Application Data

(62) Division of application No. 11/606,504, filed on Nov. 30, 2006, now Pat. No. 7,786,788.

(51) Int. Cl.  
*H03B 1/00* (2006.01)

(52) U.S. Cl. .............................. 327/333; 326/68; 326/83

(58) Field of Classification Search .................. 327/333, 327/427, 437  
See application file for complete search history.

(56) References Cited

U.S. PATENT DOCUMENTS

| 5,378,932 | A | 1/1995 | Shin |
| 6,043,679 | A | 3/2000 | Kwon |
| 6,756,835 | B2 * | 6/2004 | Yu ................................. 327/333 |
| 6,922,095 | B2 * | 7/2005 | Chiu ............................. 327/333 |
| 6,930,518 | B2 | 8/2005 | Kim |
| 6,987,413 | B2 * | 1/2006 | Kawasaki et al. ............. 327/333 |
| 7,061,298 | B2 * | 6/2006 | Mentze et al. ................ 327/333 |
| 7,196,547 | B2 | 3/2007 | Kozawa |
| 7,362,158 | B2 | 4/2008 | Park |
| 7,427,877 | B2 | 9/2008 | Komai |
| 2003/0227315 | A1 | 12/2003 | Yu |

FOREIGN PATENT DOCUMENTS

| TW | 257769 | 7/2006 |
| TW | 261970 | 9/2006 |
| TW | 200636668 | 10/2006 |

OTHER PUBLICATIONS

English Abstract of TW200636668.  
English Abstract of TW261970.  
Office Action in related U.S. Appl. No. 11/606,504 mailed Oct. 26, 2009.

* cited by examiner

*Primary Examiner* — Hai L Nguyen

(57) ABSTRACT

An exemplary embodiment of such a system includes: a level shifter operative to transform an input signal into an output signal, the level shifter includes: a voltage distributor operative to receive the input signal and distribute potential levels at a first node and a second node to respectively output a first signal and a second signal, and the voltage distributor includes: a current limiter, operative to provide a limited current passing through the first node; a switch, operative to selectively establish an electrical connection between the first node and the second node; and a first transistor having a first electrode, a second electrode, and a first control electrode, wherein the first electrode is connected to the second node, the second electrode is utilized to receive the input signal, and the first control electrode is coupled to the first node; and an output circuit, operative to generate the output signal.

9 Claims, 3 Drawing Sheets

SYSTEMS INCLUDING LEVEL SHIFTER HAVING VOLTAGE DISTRIBUTOR

CROSS-REFERENCE TO RELATED APPLICATION

This application is a divisional of U.S. utility application entitled "Systems Including Level Shifter Having Voltage Distributor," having Ser. No. 11/606,504, filed Nov. 30, 2006, now U.S. Pat. No. 7,786,788 which is incorporated by reference herein in its entirety.

BACKGROUND OF THE INVENTION

1. Field of the Invention

The invention relates to a system with voltage level adjustment function, and more particularly, to system with voltage level adjustment function accomplished by a level shifter utilizing only one clock to transform potential levels of the clock.

2. Description of the Prior Art

Level shifters are often utilized in all kinds of circuits to define DC levels. Furthermore, signals are often defined according to the DC levels. For example, in LCD fields, external circuits of the LCD panels may be biased by a positive voltage level 5V and a negative voltage level 0V. Inner circuits of the LCD panels may be biased by a positive voltage level 10V and a negative voltage level 0V. Assume that a signal has a 5V(0V) voltage level, which is defined as a digital 1(0) in the external circuits. If the signal is directly inputted into the inner circuits without a transformation, the inner circuits may misinterpret the signal. For example, if the signal 5V has a 1V noise, the signal may have an instant voltage 4V. Therefore, the signal may be regarded as a digital 0 in the inner circuits instead of the wanted digital 1. In other words, an error occurs.

Level shifters are utilized to solve this problem. The level shifters can transform an input signal having a 0V and 5V voltage levels into an output signal having a 10V and −10V voltage levels. After the transformation of the level shifters, misinterpretation of the signal by the inner circuits can be prevented. Therefore, the above-mentioned error does not occur.

In the prior art, the level shifter is driven by two input clock signals. In other words, the output clock signal is generated according to the two input clock signals. But it is well known that if two input clock signals are utilized, more pins need to be utilized in order to receive the input clock signals. The pin number is therefore increased, potentially reducing the reliability of the LCD panel. This causes another problem.

In U.S. Pat. No. 6,043,679, a level shifter utilizing only one input clock signal to generate a corresponding output clock signal is disclosed. The level shifter is able to change the input clock having the 0~5V voltage levels into the output clock having the −10~10V voltage levels. The above-mentioned one-clock level shifter has to be biased by the −10V and 10V biases. That is, if the 10V and 0V biases are utilized as the DC levels, because the 0V biases may not drive the level shifter well, the clock shifter will not work so correctly.

SUMMARY OF THE INVENTION

Systems with voltage level adjustment is provided. In this regard, an exemplary embodiment of such a system comprises: a level shifter for transforming an input signal having first low and high potential levels into an output signal having second low and high potential levels, the level shifter comprising: a voltage distributor operative to receive the input signal and distributing potential levels at a first node and a second node to respectively output a first signal and a second signal according to the input signal, and the voltage distributor comprising: a first transistor having a first electrode, a second electrode, and a first control electrode, wherein the second electrode is coupled to the first node, and the first control electrode receives the input signal; a switch, electrically connected between the first node and the second node, operative to selectively establish an electrical connection between the first node and the second node; and a second transistor having a third electrode, a fourth electrode, and a second control electrode, wherein the third electrode is coupled to the second node, and the second control electrode is coupled to the first node; and an output circuit, electrically connected to the voltage distributor, operative to generate the output signal according to the first signal and the second signal provided by the voltage distributor.

According to another exemplary embodiment of the claimed invention, a system comprises: a level shifter for transforming an input signal having first low and high potential levels into an output signal having second low and high potential levels, the level shifter comprising: a voltage distributor operative to receive the input signal and distributing potential levels at a first node and a second node to respectively output a first signal and a second signal according to the input signal, and the voltage distributor comprising: a current limiter, electrically connected to the first node, operative to provide a limited current passing through the first node; a switch, electrically connected to the first node and the second node, operative to selectively establish an electrical connection between the first node and the second node; and a first transistor having a first electrode, a second electrode, and a first control electrode, wherein the first electrode is connected to the second node, the second electrode is utilized to receive the input signal, and the first control electrode is coupled to the first node; and an output circuit, electrically connected to the voltage distributor, operative to generate the output signal according to the first signal and the second signal provided by the voltage distributor.

The present invention level shifter utilize only one input clock signal to generate the output clock signal such that the pin number is not increased. This can ensure the reliability of the LCD panel. Furthermore, the present invention level shifter can be utilized to generate the output clock signal having wider range of the DC voltage levels. Therefore, the present invention can be utilized in more kinds of circuits than the prior art level shifter.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
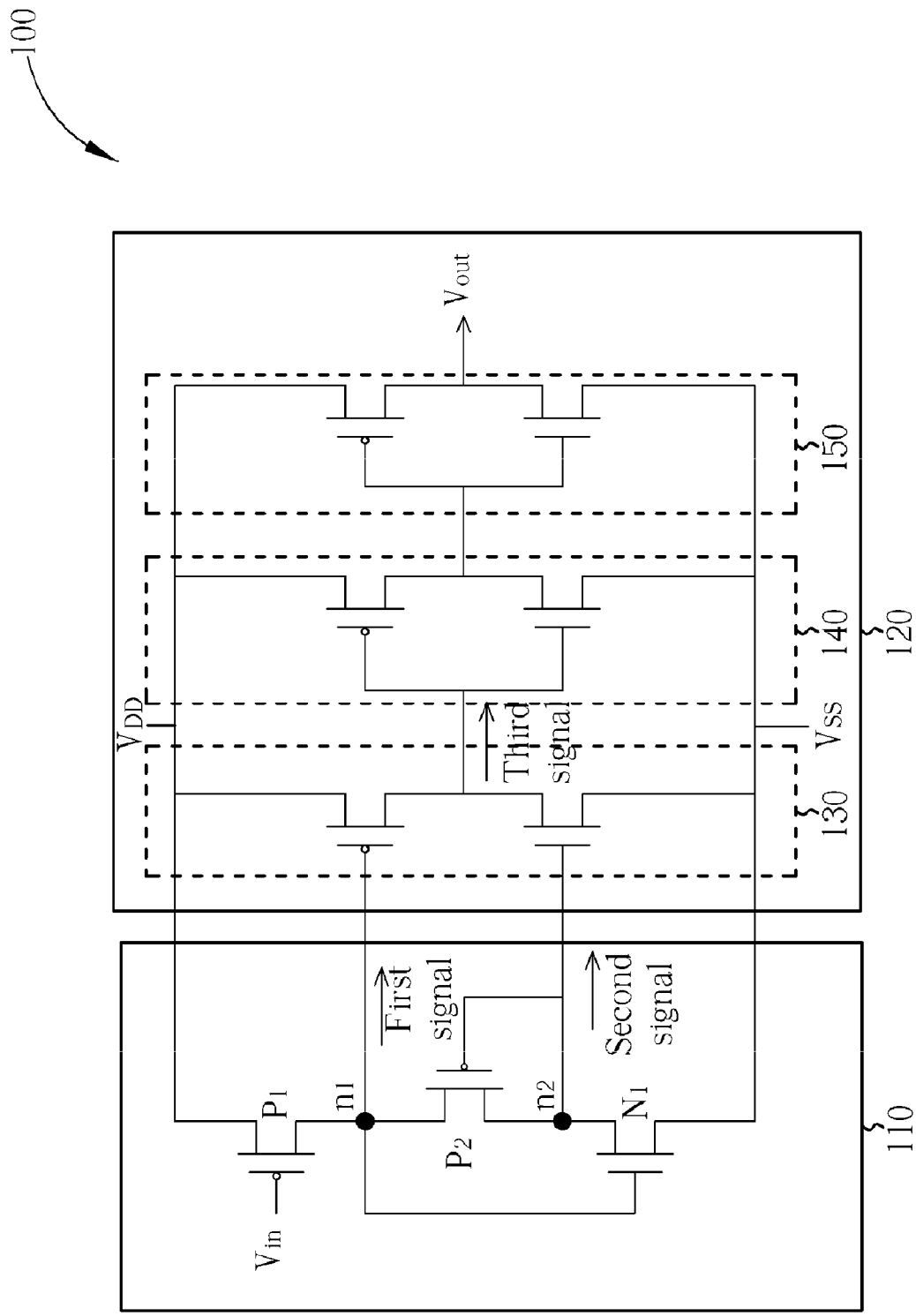
FIG. 1 is a diagram of a level shifter of a first embodiment according to the present invention.

Please refer to FIG. 1, which is a diagram of a level shifter 100 of a first embodiment according to the present invention.

As shown in FIG. 1, the level shifter 100 comprises a voltage distributor 110 and an output circuit 120. The voltage distributor 110 is utilized to distribute a first signal on a first node n1 and a second signal on a second node n2 according to an input signal $V_{in}$. The voltage distributor 110 comprises two PMOS transistors P1 and P2, and an NMOS transistor N1.

In addition, the circuit structure of the voltage distributor 110 is illustrated as follows. As shown in FIG. 1, first, the gate of the PMOS transistor P1 is utilized to receive the input signal $V_{in}$, where the drain of the of the PMOS transistor P1 is coupled to the node n1, and the source of the PMOS transistor P1 is coupled to a positive bias 10V. Furthermore, the PMOS transistor P2 is utilized as a switch, which has a gate coupled to the node n2, a source coupled to the node n1, and a drain coupled to the node n2. Finally, the NMOS transistor N1 has a gate coupled to the node n1, a drain coupled to the n2, and a source coupled to a negative bias −10V.

Please note that the size of the PMOS transistor P2 is larger than the NMOS transistor N1. This means that the PMOS transistor P2 can allow larger currents than the NMOS transistor N1. The reason for this size relationship of the PMOS transistor P2 and the NMOS transistor N1 will be illustrated in the following description.

In order to explain the function and the operation of the voltage distributor, now assume that the input signal $V_{in}$ is a clock signal having two voltage levels 0~5V. That is, the input signal $V_{in}$ corresponds to 5V (a high voltage level) or the 0V (a low voltage level).

When the input signal $V_{in}$ corresponds to a low voltage level (0V), the PMOS transistor P1 is turned on such that the voltage level of the node n1 is pulled up by the positive bias 10V. Furthermore, the NMOS transistor N1 is also turned on because the node n1 corresponds to a high voltage (about 10V). Therefore, the node n2 is pulled down by the negative bias −10V. But when the node n2 corresponds to a low voltage level, the PMOS transistor P2 (utilized as a switch) is turned on to establish the electrical connection between the node n1 and the node n2. Please note that as mentioned previously, the size of the PMOS transistor P2 is larger than the NMOS transistor N1, and the PMOS transistor P2 allows more currents than the NMOS transistor N1. Hence, the voltage level of node n2 is influenced more quickly by the voltage level of the node n1 than the negative bias −10V. This means that the voltage level is then quickly pulled up. In the end, the two nodes n1 and n2 both correspond to high voltage levels.

On the other hand, when the input signal $V_{in}$ corresponds to a high voltage (e.g. 5V), the PMOS transistor P1 is almost turned off (this means that the PMOS transistor P1 only allows very few current to pass through). But when the NMOS transistor N1 remains on, the voltage level of the node n2 is pulled down by the negative bias −10V. In addition, when the voltage level of the node n2 corresponds to a low voltage, the PMOS transistor P2 is turned on to establish the electrical connection between the nodes n1 and n2 such that the voltage level of the node n1 is pulled down. Therefore, in the end, the voltage levels of the nodes n1 and n2 both correspond to low voltage levels.

Please note that when the input signal $V_{in}$ corresponds to a high voltage level, the first signal of node n1 and the second signal of the node n2 correspond to low voltage levels. In addition, when the input signal $V_{in}$ corresponds to a low voltage level, the first signal of the node n1 and the second signal of the node n2 correspond to high voltage levels. In other words, the first and second signals have an inverted phase of the input signal $V_{in}$.

Now the output circuit 120 will be examined. As shown in FIG. 1, the output circuit 120 is an inverter circuit. In this embodiment, the output circuit comprises three inverters 130, 140, and 150. The inverter 130 is a two-level inverter (this means that the inverter 130 has two inputs). The inverters 140 and 150 are typical inverters, which have only one input and one output. As known by those skilled in the art, the inverter is utilized to change the phase of its input signal to be an inverted phase. Therefore, after the transformation of the inverter 130, the phase of the third signal, which is outputted by the inverter 130, is transformed to be the same as the original phase of the input signal $V_{in}$.

In addition, because the first signal, second signal, and the third signal are all pulled up/down by the biases 10V and −10V, the amplitudes of the first, second, and third signals correspond to about 10V and −10V instead of the original voltage levels 0 and 5V.

The inverters 140 and 150 are utilized to pull up/down the third signal to generate the output signal $V_{out}$. Therefore, the output signal $V_{out}$ can be closer to the voltage levels 10V and −10V than the third signal. Please note that even if only one inverter 130 is utilized, or only the inverter 130 and the inverter 140 are both utilized, the whole level shifter 100 is able to work. The number of the inverters is only utilized as an embodiment, not a limitation of the present invention. In other words, the three inverters 130, 140, and 150 can be regarded as an optimized circuit in order to obtain better function and operation.

Figure 2:
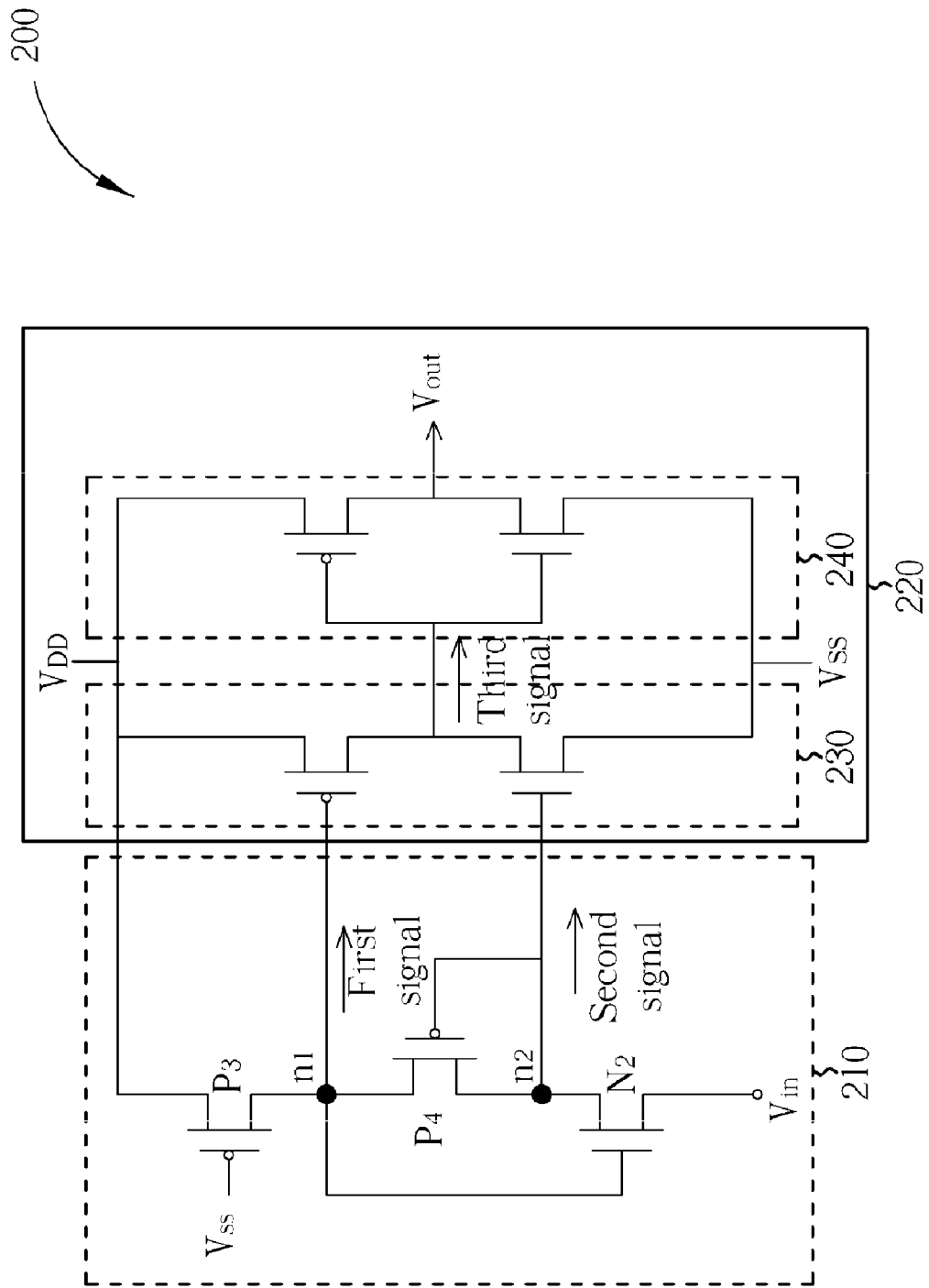
FIG. 2 is a diagram of a level shifter of a second embodiment according to the present invention.

Please refer to FIG. 2, which is a diagram of a level shifter 200 of a second embodiment according to the present invention. Similarly, the level shifter 200 comprises a voltage distributor 210 and an output circuit 220. The voltage distributor 210 is also utilized to distribute a first signal on a first node n1 and a second signal on a second node n2 according to the input signal $V_{in}$. The voltage distributor 210 comprises two PMOS transistors P3 and P4, and an NMOS transistor N2.

In addition, the circuit structure of the voltage distributor 210 is illustrated as follows. As shown in FIG. 2, first, the PMOS transistor P3 is utilized as a current limiter for proving a limited current, wherein the PMOS transistor P3 has a gate coupled to an outer bias Vss, a drain coupled to the node n1, and a source coupled to a positive bias 10V. Furthermore, the PMOS transistor P4 is utilized as a switch, which has a gate coupled to the node n2, a source coupled to the node n1, and a drain coupled to the node n2. The NMOS transistor N2 has a gate coupled to the node n1, a drain coupled to the node n2, and a source coupled to the input signal $V_{in}$ for receiving the input signal $V_{in}$.

Similar to the level shifter 100 of the first embodiment, in order to explain the function and the operation of the voltage distributor, in the level shifter 200, assume that the input signal $V_{in}$ is a clock signal having two voltage levels 0-5V. That is, the input signal $V_{in}$ corresponds to 5V (a high voltage level) or the 0V (a low voltage level).

Please note that because the gate of the PMOS transistor P3 is coupled to the bias Vss, the PMOS transistor P3 is constantly turned on. For example, the PMOS transistor P3 can operate at a saturation region such that a certain current can be provided by the positive bias 10V. Therefore, the voltage level of the node n1 is pulled up through the certain current by the bias 10V. In other words, the node n1 has an initial high voltage level.

Because the node n1 has an initial high voltage level, the NMOS transistor N2 is turned on due to the high voltage level of node n1. Therefore, the input signal $V_{in}$ can be transferred through the NMOS transistor N2 to the node n2. Here, when the input signal $V_{in}$ corresponds to a high voltage level (e.g. 5V), the node n2 also corresponds to a high voltage level. In addition, because the initial voltage level of the node n1 corresponds to a high voltage level, the two nodes n1 and n2 both correspond to high voltage levels.

On the other hand, when the input signal $V_{in}$ corresponds to a low voltage (e.g. 0V), the input signal $V_{in}$ is also transferred to the node n2. This means that the node n2 is pulled down. Therefore, the voltage level of the node n2 corresponds to a low voltage level. Moreover, the PMOS transistor P4 is turned on to establish the electrical connection between the nodes n1 and n2. Because the PMOS transistor P3 is utilized as a current limiter and the size of the PMOS transistor P4 is large, the node n1 is pulled down. Therefore, the voltage levels of the nodes n1 and n2 are quite similar. In other words, the two nodes n1 and n2 both correspond to low voltage levels.

Please note that when the input signal $V_{in}$ corresponds to a low voltage level, the first signal of node n1 and the second signal of the node n2 also correspond to low voltage levels. In addition, when the input signal $V_{in}$ corresponds to a high voltage level, the first signal of the node n1 and the second signal of the node n2 correspond to high voltage levels. In other words, the first and second signals have a same phase of the input signal $V_{in}$.

Now the output circuit 220 will be detailed. As shown in FIG. 1, the output circuit 220 is an inverter circuit. In this embodiment, the output circuit comprises two inverters 230 and 240. The inverter 230 is a two-level inverter (this means that the inverter 230 has two inputs). The inverter 230 is a typical inverter, which has only one input and one output. As known by those skilled in the art, the inverter is utilized to change the phase of its input signal to be an inverted phase. Therefore, after the transformation of the inverter 230 and 240, the phase of the output signal $V_{out}$ can be the same as the phase of the input signal $V_{in}$.

The inverter 240 is utilized to pull up/down the third signal (which is outputted by the inverter 230) to generate the output signal $V_{out}$. Therefore, the output signal $V_{out}$ can be closer to the voltage levels 10V and −10V than the third signal. Please note that even if only one inverter 230 is utilized, the whole level shifter 200 is able to work. The number of the inverters is only utilized as an embodiment, not a limitation of the present invention. In other words, the two inverters 230 and 240 can be regarded as an optimized circuit in order to obtain better function and operation.

Please note that in the first and the second embodiments, the sizes of all transistors are not limited. That is, designers can tune a better circuit characteristic to perform more efficiently. Furthermore, each threshold voltage of the transistors is not limited, either. The designers can select needed threshold voltages of the transistors according to different design demands.

Furthermore, according to the simulation results of the two embodiments, even if the two level shifters 100 and 200 can be driven by biases 10V and 0V, the level shifters 100 and 200 can operate correctly. Therefore, the present invention level shifter can be utilized more widely.

Please note that the level shifter can be utilized in LCD fields in order to transform signals of the external circuits into signals of the inner circuits of the LCD panels. As known by those skilled in the art, the level shifter can be utilized in all kinds of circuits including digital circuits or analog circuits. In other words, if a signal needs to be transformed in order to adjust its DC levels, the present invention level shifter can be utilized.

Please note that the PMOS transistors P2 and P4 are utilized as switches. Therefore, the PMOS transistors P2 and P4 are utilized as embodiments, not limitations. In other words, other switches can be utilized, for example, transmission gates can also be utilized. This also obeys the spirit of the present invention.

Figure 3:
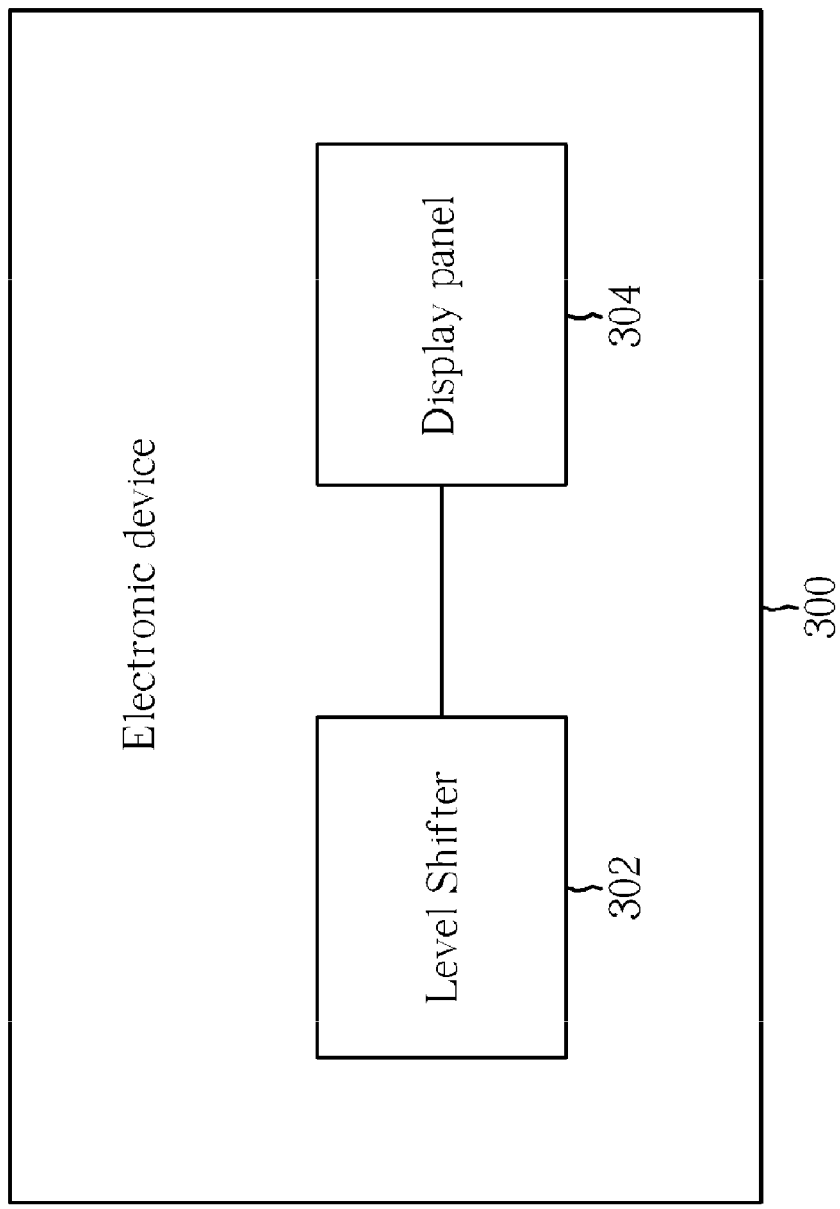
FIG. 3 shows a system capable of displaying images according to an embodiment of the present invention.

Please refer to FIG. 3. FIG. 3 shows a system capable of displaying images according to an embodiment of the present invention. In this embodiment, the system is implemented as an electronic device 300. As shown in FIG. 3, the electronic device 300 includes a level shifter 302 and a display panel 304 (e.g., an LCD panel), where the level shifter 302 shifts the voltage level of an external signal to another voltage level meeting voltage requirements of internal circuits of the display panel 304. It should be noted that the level shifter 302 has the aforementioned circuit architecture shown in FIG. 1 or FIG. 2, and further description is omitted for brevity. In addition, the electronic device 300 can be a mobile phone, digital camera, PDA (personal data assistant), notebook computer, desktop computer, television, car display, or portable DVD player, for example.

In contrast to the prior art, the present invention level shifter utilizes only one input clock signal to generate the output clock signal such that the pin number is not increased. This can ensure the reliability of the LCD panel. Furthermore, the present invention level shifter can be utilized to generate the output clock signal having wider range of the DC voltage levels. Therefore, the present invention can be utilized in more kinds of circuits than the prior art level shifter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system for displaying images, comprising:
   a level shifter operative to transform an input signal having first low and high potential levels into an output signal having second low and high potential levels, the level shifter comprising:
      a voltage distributor operative to receive the input signal and distribute potential levels at a first node and a second node to respectively output a first signal and a second signal according to the input signal, and the voltage distributor comprising:
         a current limiter, electrically connected to the first node, operative to provide a limited current passing through the first node;
         a switch, electrically connected to the first node and the second node, operative to selectively establish an electrical connection between the first node and the second node; and
         a first transistor having a first electrode, a second electrode, and a first control electrode, wherein the first electrode is connected to the second node, the second electrode is utilized to receive the input signal, and the first control electrode is coupled to the first node; and
      an output circuit, electrically connected to the voltage distributor, operative to generate the output signal according to the first signal and the second signal provided by the voltage distributor;
   wherein the second low potential is lower than the first low potential.

2. The system of claim 1, wherein the second high potential is higher than the first high potential.

3. The system of claim 1, wherein the first signal and the second signal have a substantially same phase as the input signal.

4. The system of claim 1, wherein the current limiter is a second transistor having a third electrode, a fourth electrode coupled to the first node, and a second control electrode coupled to a bias operative to provide the limited current passing through the first node.

5. The system of claim 1, wherein the switch is a third transistor having a third control electrode coupled to the first node, a fifth electrode coupled to the second node, and a sixth electrode coupled to the first node.

6. The system of claim 5, wherein the third transistor is a PMOS transistor.

7. The system of claim 1, further comprising a display panel, wherein the level shifter is coupled to the display panel and operative to provide the output signal to the display panel.

8. The system of claim 7, further comprising an electronic device, wherein the electronic device comprises the display panel and the level shifter.

9. The system of claim 8, wherein the electronic device is a mobile phone, digital camera, PDA (personal digital assistant), notebook computer, desktop computer, television, car display, or portable DVD player.

* * * * *